US012278167B2

(12) United States Patent
Chang et al.

(10) Patent No.: US 12,278,167 B2
(45) Date of Patent: Apr. 15, 2025

(54) SEMICONDUCTOR DIE INCLUDING THROUGH SUBSTRATE VIA BARRIER STRUCTURE AND METHODS FOR FORMING THE SAME

(71) Applicant: Taiwan Semiconductor Manufacturing Company Limited, Hsinchu (TW)

(72) Inventors: Jen-Yuan Chang, Hsinchu (TW); Chia-Ping Lai, Hsinchu (TW); Shih-Chang Chen, Hsinchu (TW); Tzu-Chung Tsai, Hsinchu (TW); Chien-Chang Lee, Miaoli County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/230,135

(22) Filed: Aug. 3, 2023

(65) Prior Publication Data
US 2023/0386972 A1 Nov. 30, 2023

Related U.S. Application Data

(62) Division of application No. 17/472,181, filed on Sep. 10, 2021.

(Continued)

(51) Int. Cl.
*H01L 23/48* (2006.01)
*H01L 21/768* (2006.01)
(Continued)

(52) U.S. Cl.
CPC ...... *H01L 23/481* (2013.01); *H01L 21/76898* (2013.01); *H01L 23/49822* (2013.01);
(Continued)

(58) Field of Classification Search
CPC .......... H01L 23/49827; H01L 23/5384; H01L 23/481; H01L 29/4175;
(Continued)

(56) References Cited

U.S. PATENT DOCUMENTS

7,786,584 B2 * 8/2010 Barth .................... H01L 23/481
438/597
9,852,965 B2 * 12/2017 Lee ....................... H01L 23/481
(Continued)

*Primary Examiner* — Younes Boulghassoul
*Assistant Examiner* — Quinton A Brasfield
(74) *Attorney, Agent, or Firm* — The Marbury Law Group, PLLC (57) ABSTRACT

A die includes: a semiconductor substrate having a front side and an opposing back side; a dielectric structure including a substrate oxide layer disposed on the front side of the semiconductor substrate and interlayer dielectric (ILD) layers disposed on the substrate oxide layer; an interconnect structure disposed in the dielectric structure; a through-silicon via (TSV) structure extending in a vertical direction from the back side of the semiconductor substrate through the front side of the semiconductor substrate, such that a first end of the TSV structure is disposed in the interconnect structure; and a TSV barrier structure including a barrier line that contacts the first end of the TSV structure, and a first seal ring disposed in the substrate oxide layer and that surrounds the TSV structure in a lateral direction perpendicular to the vertical direction.

20 Claims, 8 Drawing Sheets

Related U.S. Application Data (60) Provisional application No. 63/162,970, filed on Mar. 18, 2021.

(51) Int. Cl.
  *H01L 23/498* (2006.01)
  *H01L 23/532* (2006.01)
  *H01L 23/58* (2006.01)
  *H01L 25/065* (2023.01)

(52) U.S. Cl.
  CPC .. *H01L 23/53228* (2013.01); *H01L 23/53257* (2013.01); *H01L 23/585* (2013.01); *H01L 25/0657* (2013.01)

(58) Field of Classification Search
  CPC ............ H01L 2225/06541–06544; H01L 2225/06548; H01L 21/76898; H01L 25/0657; H01L 25/0652; H01L 25/043; H01L 25/071; H01L 25/074; H01L 25/0756; H01L 25/112; H01L 25/117; H01L 2224/08145; H01L 27/0688; H01L 23/528–5283; H01L 21/76877–76883; H01L 23/5226; H01L 24/80; H01L 2224/29005–29009; H01L 2224/29022; H01L 2224/8034–80357; H01L 2224/8334
  See application file for complete search history.

(56) References Cited

U.S. PATENT DOCUMENTS

| | | | | |
|---|---|---|---|---|
| 2011/0133333 | A1* | 6/2011 | Kwon | H01L 23/481 257/E21.585 |
| 2015/0102497 | A1* | 4/2015 | Park | H01L 21/76898 257/774 |
| 2015/0235949 | A1* | 8/2015 | Yu | H01L 25/0652 257/774 |
| 2017/0200675 | A1* | 7/2017 | Jung | H01L 23/53295 |

* cited by examiner

SEMICONDUCTOR DIE INCLUDING THROUGH SUBSTRATE VIA BARRIER STRUCTURE AND METHODS FOR FORMING THE SAME

RELATED APPLICATIONS

This application is a divisional application of U.S. patent application Ser. No. 17/472,181 entitled "Semiconductor Die Including Through Substrate Via Barrier and Methods for Forming the Same," filed on Sep. 10, 2021, which claims priority to U.S. Provisional Patent Application No. 63/162,970 entitled "New Design for System on Integrated Chip (SoIC) Back-Side Through Substrate Via (BTSV)" filed on Mar. 18, 2021, the entire contents of both of which are hereby incorporated by reference for all purposes.

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller semiconductor packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices that include through silicon via (TSV) structures, and specifically, to semiconductor dies that include TSV barrier structures that are configured to reduce and/or prevent the intrusion of contaminants such as moisture, into the semiconductor die, during the formation of TSV structures. In particular, the configuration of the TSV barrier structures allows for TSV structures to be formed using back side etching processes, without degrading die performance.

Figures 1A, 1B, 1C:
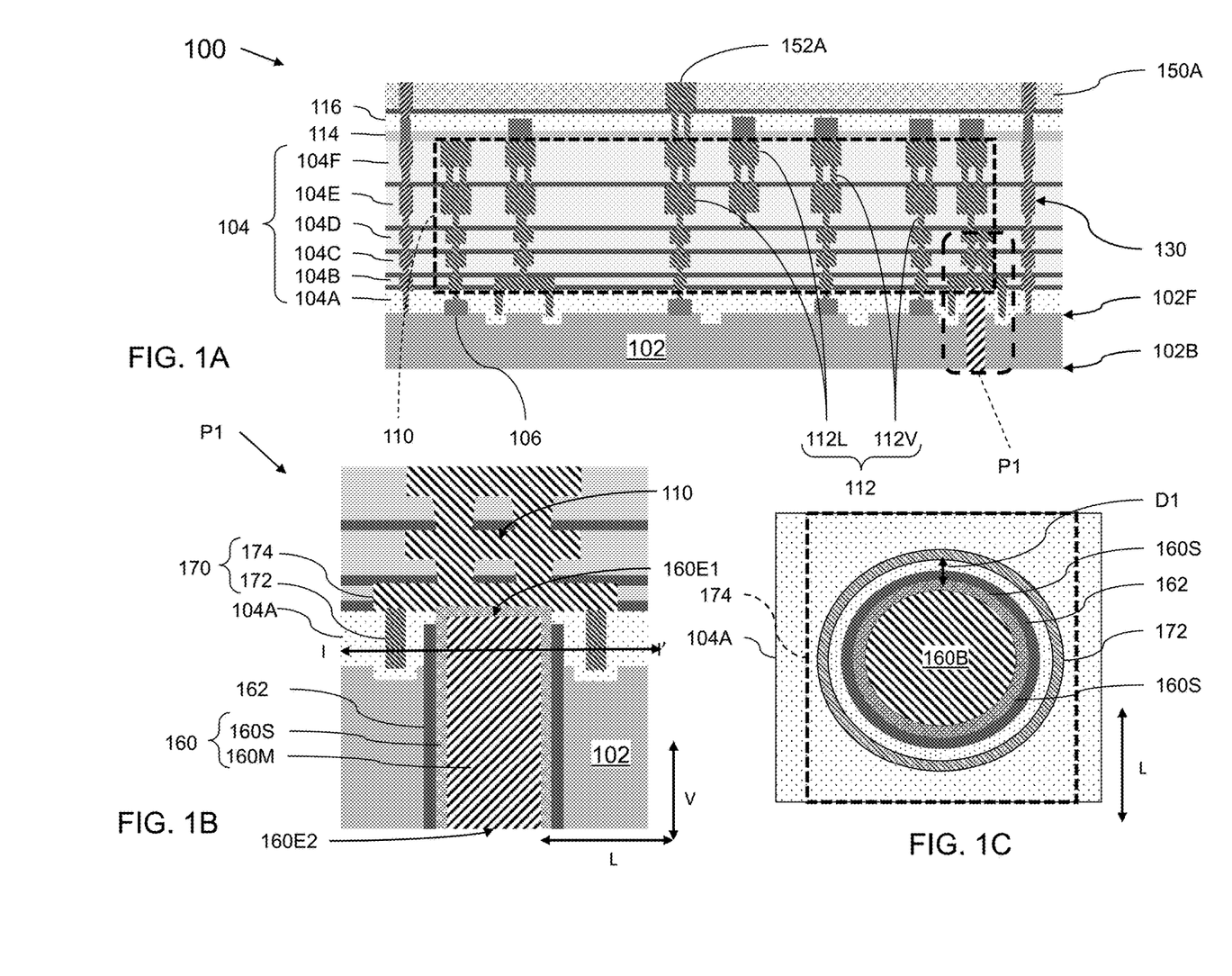
FIG. 1A is a vertical cross-sectional view of a first die 100, according to various embodiments of the present disclosure.
FIG. 1B is an enlarged view of a portion P1 of FIG. 1A.
FIG. 1C is a horizontal cross-sectional view taken along line I-I' of FIG. 1B and including the outline of an overlapping barrier line.

FIG. 1A is a vertical cross-sectional view of a die 100, according to various embodiments of the present disclosure, FIG. 1B is an enlarged view of a portion P1 of FIG. 1A, and FIG. 1C is a horizontal cross-sectional view taken along line I-I' of FIG. 1B and including the outline of an overlapping barrier line.

Referring to FIGS. 1A-1C, the die 100 may be, for example, an application-specific integrated circuit (ASIC) chip, an analog chip, a sensor chip, a wireless and radio frequency chip, a voltage regulator chip, or a memory chip. In some embodiments, the die 100 may be an active component or a passive component. In some embodiments, the die 100 includes a semiconductor substrate 102, a substrate oxide layer 104A, a dielectric structure 104, a interconnect structure 110 embedded within the dielectric structure 104, a die seal ring 130, a through-silicon via (TSV) structure 160, and a TSV barrier structure 170.

In some embodiments, the semiconductor substrate 102 may include an elementary semiconductor such as silicon or germanium and/or a compound semiconductor such as silicon germanium, silicon carbide, gallium arsenic, indium arsenide, gallium nitride or indium phosphide. In some embodiments, the semiconductor substrate 102 may be a semiconductor-on-insulator (SOI) substrate. In various embodiments, the semiconductor substrate 102 may take the form of a planar substrate, a substrate with multiple fins, nanowires, or other forms known to people having ordinary skill in the art. Depending on the requirements of design, the semiconductor substrate 102 may be a P-type substrate or an N-type substrate and may have doped regions therein. The doped regions may be configured for an N-type device or a P-type device, respectively.

The semiconductor substrate 102 may include a front side 102F and an opposing back side 102B. In some embodiments, the semiconductor substrate 102 includes isolation structures defining at least one active area on the front side 102F of the semiconductor substrate 102, and a device layer may be disposed on/in the active area. The device layer may include a variety of devices. In some embodiments, these devices may include active components, passive components, or a combination thereof. In some embodiments, these devices may include integrated circuits devices. The devices may be, for example, transistors, capacitors, resistors, diodes, photodiodes, fuse devices, or other similar devices. In some embodiments, the device layer includes a gate structure, source/drain regions, spacers, and the like.

The dielectric structure 104 may be a single layer or a multiple-layer dielectric structure. For example, as shown in FIG. 1A, the dielectric structure 104 may include a substrate oxide layer 104A and inter-layer dielectric (ILD) layers 104B-104F disposed thereon. However, the various embodiments disclosed herein are not limited to any particular number of dielectric layers.

The substrate oxide layer 104A may be disposed on the front side 102F of the semiconductor substrate 102 and may be formed during a middle-end-of-line (MEOL) process. However, the substrate oxide layer 104A may be alternatively formed during a front-end-of-line (FEOL) process, or a back-end-of-line (BEOL) process. The substrate oxide layer 104A may be formed of a dielectric material such as silicon oxide, silicon oxynitride, silicon nitride, a low dielectric constant (low-k) material, or a combination thereof. Other suitable dielectric materials may be within the contemplated scope of disclosure.

In some embodiments, the ILD layers 104B-104F may be formed of a dielectric material such as silicon oxide, silicon oxynitride, silicon nitride, a low dielectric constant (low-k) material, or a combination thereof. Other suitable dielectric materials may be within the contemplated scope of disclosure.

The substrate oxide layer 104A and the ILD layers 104B-104F may be formed by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

The interconnect structure 110 may include metal features 112 formed in the dielectric structure 104. The metal features 112 be formed of any suitable electrically conductive material, such as copper (Cu), gold (Au), silver (Ag), aluminum (Al), tungsten (W), titanium (Ti), alloys thereof, or the like. In various embodiments, the metal features 112 may include copper at an atomic percentage greater than 80%, such as greater than 90% and/or greater than 95% although greater or lesser percentages may be used.

In some embodiments, barrier layers (not shown) may surround each of the metal features 112, to prevent the material of the metal features 112 from migrating to the semiconductor substrate 102. The barrier layer may include Ta, TaN, Ti, TiN, CoW, or combinations thereof, for example. Other suitable barrier layer materials may be within the contemplated scope of disclosure.

The metal features 112 may include electrically conductive metal lines 112L and via structures 112V. The via structures 112V may operate to electrically connect the metal lines 112L disposed in adjacent ILD layers 104B-104F. The metal features 112 may be electrically connected to substrate pads 106 disposed on the semiconductor substrate 102, such that the interconnect structure 110 may electrically interconnect semiconductor devices formed on the semiconductor substrate 102.

An interconnect passivation layer 114 may be disposed on the dielectric structure 104, and an interconnect planarization layer 116 may be disposed on the interconnect passivation layer 114. The interconnect passivation layer 114 may be formed of formed of a passivation material, such as, silicon oxide, silicon nitride, benzocyclobutene (BCB) polymer, polyimide (PI), polybenzoxazole (PBO) combinations thereof, or the like. Other suitable passivation materials may be within the contemplated scope of disclosure. In some embodiments, the interconnect passivation layer 114 may include multiple layers of such passivation materials.

The interconnect planarization layer 116 may be formed of a material that is water resistant, resistant to stress, has a high step coverage and is uniform. For example, the interconnect planarization layer 116 may be formed of silicon nitride but may alternatively be a different material such as silicon carbide, silicon oxynitride, silicon oxide, polymer materials, polyimides, resins, low-viscosity liquid epoxies, or spin-on glass (SOG) materials. Other suitable planarization materials may be within the contemplated scope of disclosure.

The die seal ring 130 may extend around the periphery of the die 100. For example, the die seal ring 130 may be disposed in the dielectric structure 104 and may laterally surround the interconnect structure 110. The die seal ring 130 may be configured to protect the interconnect structure 110 from contaminant diffusion and/or physical damage during device processing, such as plasma etching and/or deposition processes.

The die seal ring 130 may include copper at an atomic percentage greater than 80%, such as greater than 90% and/or greater than 95% although greater or lesser percentages may be used. However, other die seal ring materials are within the scope of the present disclosure. The die seal ring 130 may include conductive lines and via structures that are connected to each other and may be formed simultaneously with the metal lines 112L and via structures 112V. The die seal ring 130 may be electrically isolated from the metal features 112.

In some embodiments, the metal features 112, and/or the die seal ring 130 may be formed by a dual-Damascene process or by multiple single Damascene processes. Single-Damascene processes generally form and fill a single feature with copper per Damascene stage. Dual-Damascene processes generally form and fill two features with a metal (e.g., copper) at once, e.g., a trench and overlapping through-hole may both be filled with a single copper deposition using dual-Damascene processes. In alternative embodiments, the metal features 112, and/or the die seal ring 130 may be formed by an electroplating process.

For example, the Damascene processes may include patterning the dielectric structure 104 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the dielectric structure 104.

In particular, the patterning, metal deposition, and planarizing processes may be performed for each of the ILD layers 104B-104F, in order to form the interconnect structure 110 and/or the die seal ring 130. For example, ILD layer 104B may be deposited and patterned to form openings. A deposition process may then be performed to fill the openings in the ILD layer 104B. A planarization process may then be performed to remove the overburden and form metal features 112 in the ILD layer 104B. These process steps may be repeated to form the ILD layers 104C-104F and the corresponding metal features 112 and/or die seal ring 130, and thereby complete the interconnect structure 110 and/or die seal ring 130.

In some embodiments, a first bonding layer 150A may be formed on the interconnect planarization layer 116, in order to bond the die 100 to, for example, a second die or a redistribution layer (not shown). The first bonding layer 150A may be formed of a binding polymer, such as an epoxy, a polyimide (PI), a benzocyclobutene (BCB), or a polybenzoxazole (PBO). First bonding pads 152A may be formed in the first bonding layer 150A to electrically connect the die 100 to another device or device structure.

With reference to FIGS. 1B and 1C, the TSV structure 160 may extend though the semiconductor substrate 102 and may be electrically connected to the interconnect structure 110. In particular, a first end 160E1 of the TSV structure 160 may be disposed in the dielectric structure 104, and an opposing second end 160E2 may be disposed on the back side 102B of the semiconductor substrate 102. In some embodiments, the TSV structure 160 may include a body 160B and a seed layer 160S. The body 160B may be formed of an electrically conductive material, such as Cu, Ni, Au, Ag, Ti, W, Al, alloys thereof, or the like. As discussed in detail below, the TSV structure 160 may be formed using a back side process that includes depositing the seed layer 160S and performing an electrochemical plating (ECP) process to form the body 160B on the seed layer 160S and complete the TSV structure 160. The seed layer 160S may be formed of an electrodeposition seed material, such as Ti, TiN, Cu, alloys thereof, or the like. In some embodiments, the seed layer 160S may not form a distinct layer on the surface of the body 160B. In other words, the elements of the seed layer 160S may be present as a gradient in the TSV structure 160.

A diffusion barrier layer 162 may be disposed around the TSV structure 160, to prevent metal diffusion from the TSV structure 160. The diffusion barrier layer 162 may include a barrier material, such as Ta, TaN, Ti, TiN, CoW, a combination thereof, or the like. The diffusion barrier layer 162 may be deposited using any suitable deposition process.

TSV Barrier Structures

TSV structures 160 may be formed using back side or front side etching and deposition processes. In particular, front-side processes may include the etching of an ILD layers, a substrate dielectric layer, and the front side of a semiconductor substrate to form a front-side trench, and a TSV structure may be formed in the front-side trench by depositing a metal on the front side of the semiconductor substrate. Back side processes may include forming a back side trench by etching the back side of a semiconductor substrate to form a back side trench that extends through the semiconductor substrate and a substrate dielectric layer disposed on the front side of the semiconductor substrate, followed by a back side deposition process.

However, the formation of front-side trenches may result in process charging, and front-side trenches may occupy space in an ILD structure that could otherwise be used for interconnect structures. The formation of back side trenches may allow for unwanted moisture and/or contaminant intrusion.

Accordingly, various embodiments of the TSV barrier structure 170 may be configured to reduce and/or prevents TSV-related moisture intrusion into the die 100. For example, the TSV barrier structure 170 may be configured to at least partially surround the first end 160E1 of the TSV structure 160. In particular, the TSV barrier structure 170 may include a first seal ring 172 and a barrier line 174. The first seal ring 172 may be formed in the substrate oxide layer 104A and may surround the TSV structure 160 in a lateral direction L parallel to a plane of the semiconductor substrate 102. The TSV structure 160 may extend through the semiconductor substrate 102 in a vertical direction V, perpendicular to the lateral direction L.

The first seal ring 172 may be circular, as shown in FIG. 1C. However, the first seal ring 172 is not limited to any particular shape, so long as the first seal ring 172 laterally surrounds the TSV structure 160. For example, the first seal ring 172 may be polygonal, ovoid, or the like, in some embodiments. The first seal ring 172 may be formed of a material such as Cu, Ni, Au, Ag, Ti, W, Al, alloys thereof, or the like. In some embodiments, the first seal ring 172 may preferably be formed of tungsten. The first seal ring 172 may directly contact and/or be bonded to the barrier line 174.

The barrier line 174 may be formed from and/or include at least a portion of one of the metal lines 112L. As such, the barrier line 174 may be formed during the formation of the metal features 112 and may be formed of the same materials as the metal features 112. The barrier line 174 may be disposed on the substrate oxide layer 104A and may completely cover the first seal ring 172 and the TSV structure 160 in the vertical direction V.

In addition, a minimum distance D1 between the first seal ring 172 and the TSV structure 160 may be the same in any lateral direction L perpendicular to the vertical direction V. In other words, a portion of the substrate oxide layer 104A that separates the first seal ring 172 from the TSV structure 160 may have a consistent thickness on all side surfaces of the TSV structure 160. Accordingly, the TSV barrier structure 170 may have an equipotential structure with respect to the TSV structure 160, which may reduce capacitive effects in the first seal ring 172 due to current flow in the TSV structure 160.

Figure 2:
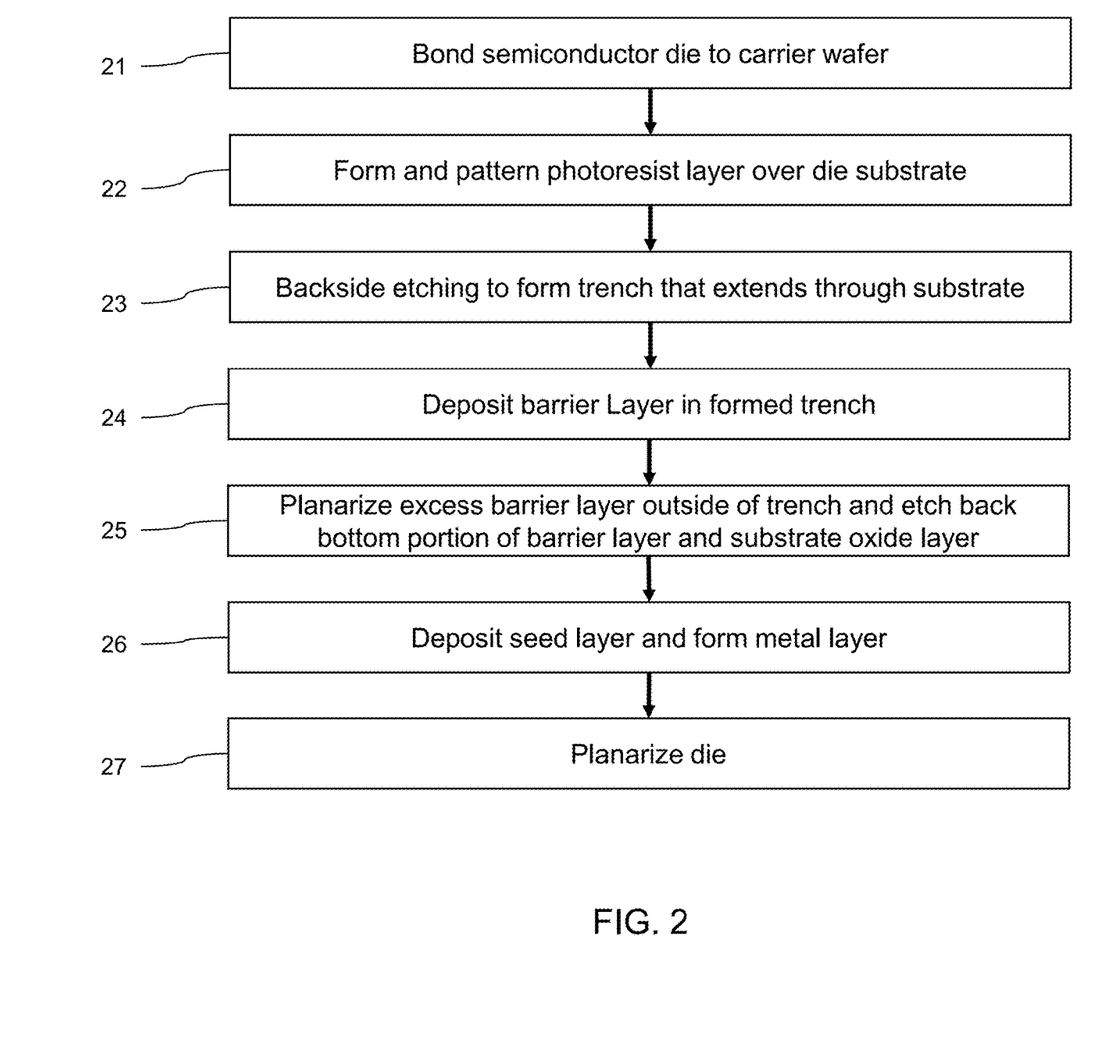
FIG. 2 is a flow chart showing a method of forming a TSV structure in a semiconductor die, according to various embodiments of the present disclosure.

FIG. 2 is a flow chart showing a method of forming a TSV structure in a semiconductor die, according to various embodiments of the present disclosure. FIGS. 3A-3G are cross-sectional views showing the operations of the method of FIG. 2, with FIGS. 3C-3G showing an enlarged portion P2 of FIG. 3B. The die 100 may be similar to the die 100 of FIGS. 1A-1C. For example, the die 100 may include a TSV structure 160 and a TSV barrier structure 170. As such, the features of the die 100 will not be described again in detail.

Figure 3A:
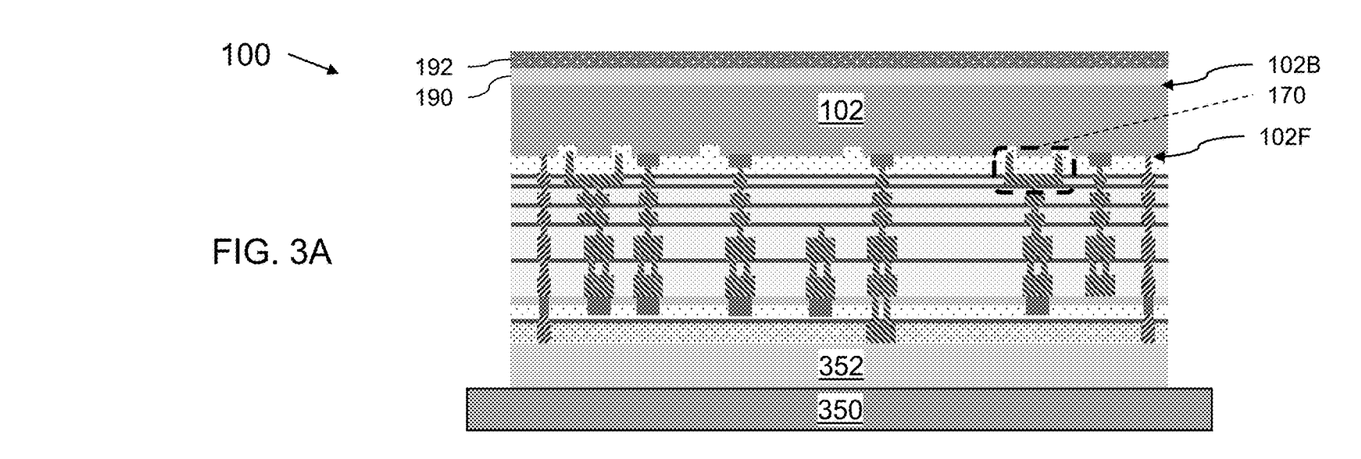
FIGS. 3A-3G are vertical cross-sectional views showing the operations of the method of FIG. 2, with FIGS. 3C-3G showing an enlarged portion P2 of FIG. 3B.

Referring to FIGS. 2 and 3A, in operation 21, the die 100 may be bonded to a carrier wafer 350. In particular, the die 100 may be singulated from a wafer including a plurality of semiconductor dies. The die 100 may then be inverted and bonded to the carrier wafer 350 by a carrier bonding layer 352, such that the front side 102F of the semiconductor substrate 102 of the die 100 faces the carrier wafer 350. The carrier wafer 350 may be a carrier wafer, such as a silicon or sapphire wafer, or the like. Any suitable bonding process may be used, such as a thermal and/or chemical bonding process. A protective layer 190 and a bonding layer 192 may be formed on the back side of the semiconductor substrate 102.

Figure 3B:
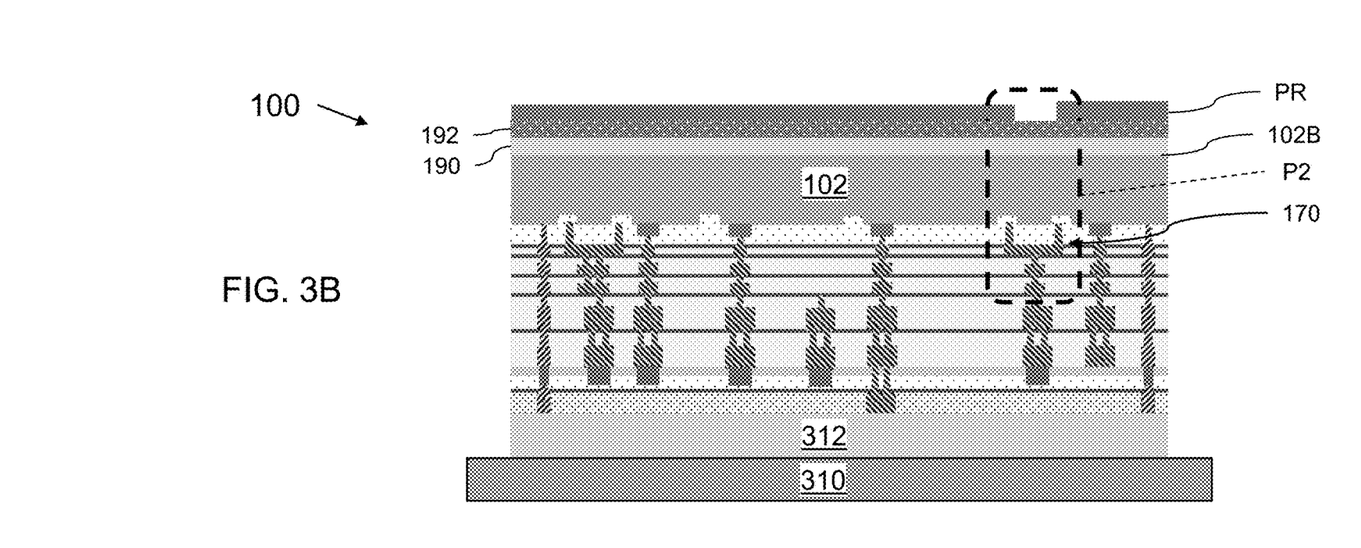

Referring to FIGS. 2 and 3B, in operation 22 a photoresist layer PR may be formed over the back side 102B of the semiconductor substrate 102. For example, a photoresist material may be deposited on the bonding layer 192, exposed, and patterned to form the photoresist layer PR. The photoresist layer PR may have an opening that faces the TSV barrier structure 170.

Figure 3C:
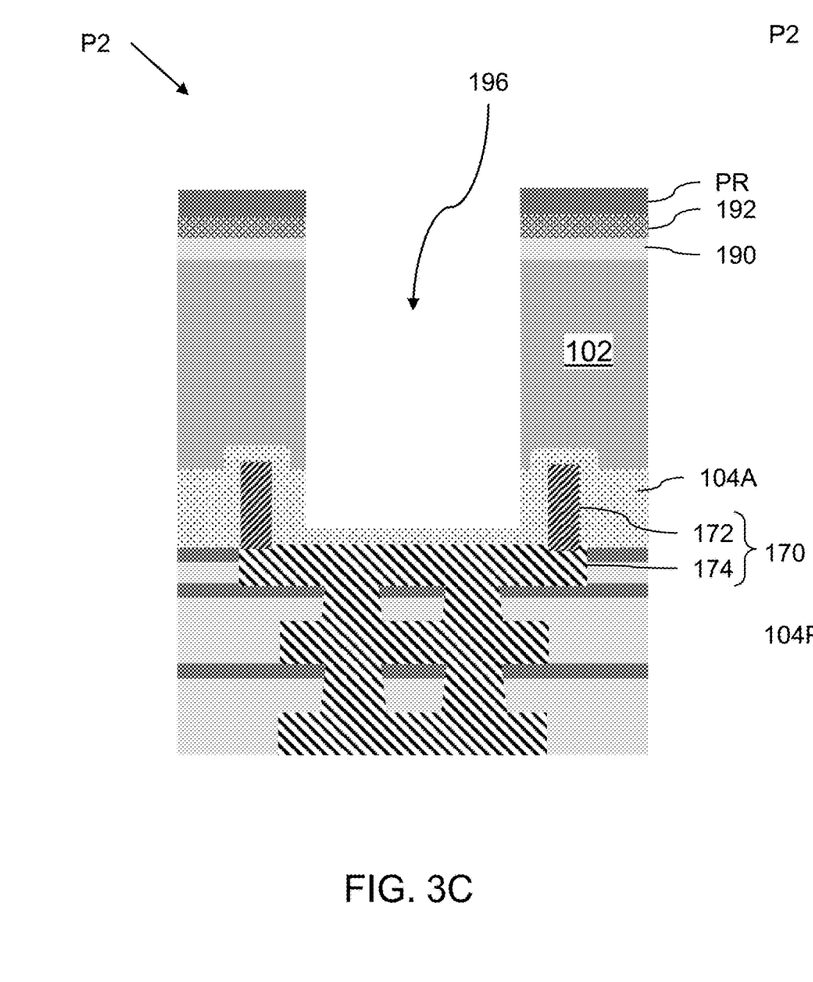

Referring to FIGS. 2 and 3C, in operation 23 a wet or dry etching process may then be performed, using the photoresist layer PR as a mask, to form a trench 196 that extends through the semiconductor substrate 102 and into the substrate oxide layer 104A. In particular, a portion of the substrate oxide layer 104A may remain on the barrier line 174 at the bottom of the trench 196. The remaining photoresist layer PR may be removed, for example, by ashing.

Figure 3D:
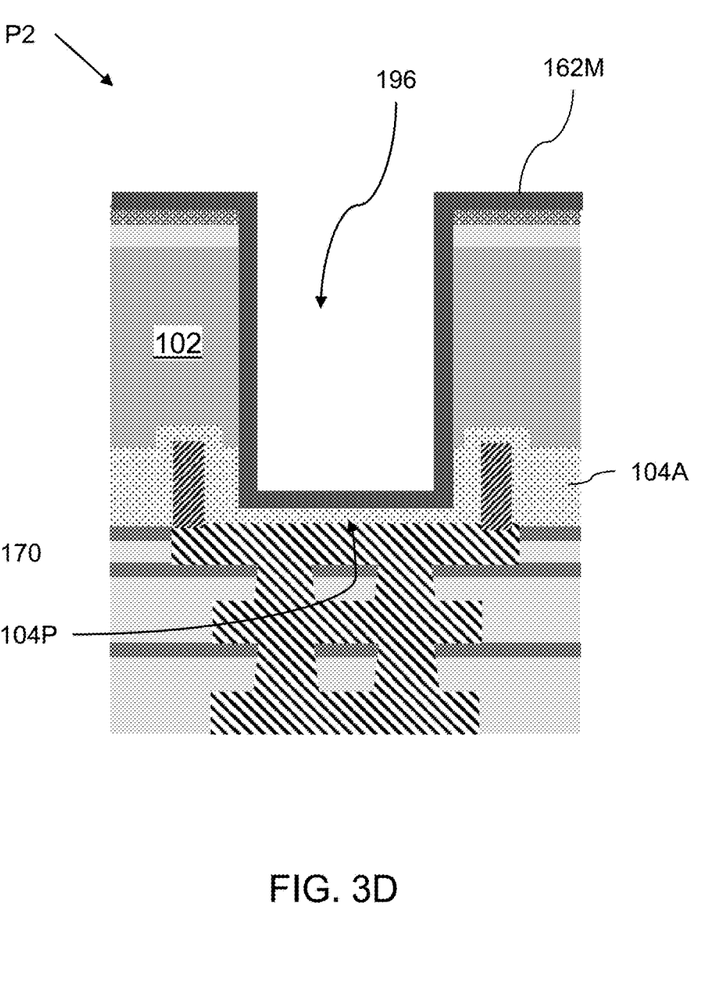

Referring to FIGS. 2 and 3D, in operation 24, a barrier layer material 162M may be deposited in the trench 196, using any suitable deposition process. In particular, the barrier layer material 162M may be separated from the TSV barrier structure 170 by the substrate oxide layer 104A, including a portion 104P of the substrate oxide layer 104A that covers the barrier line 174, in order to prevent and/or reduce liner tool contamination.

Figure 3E:
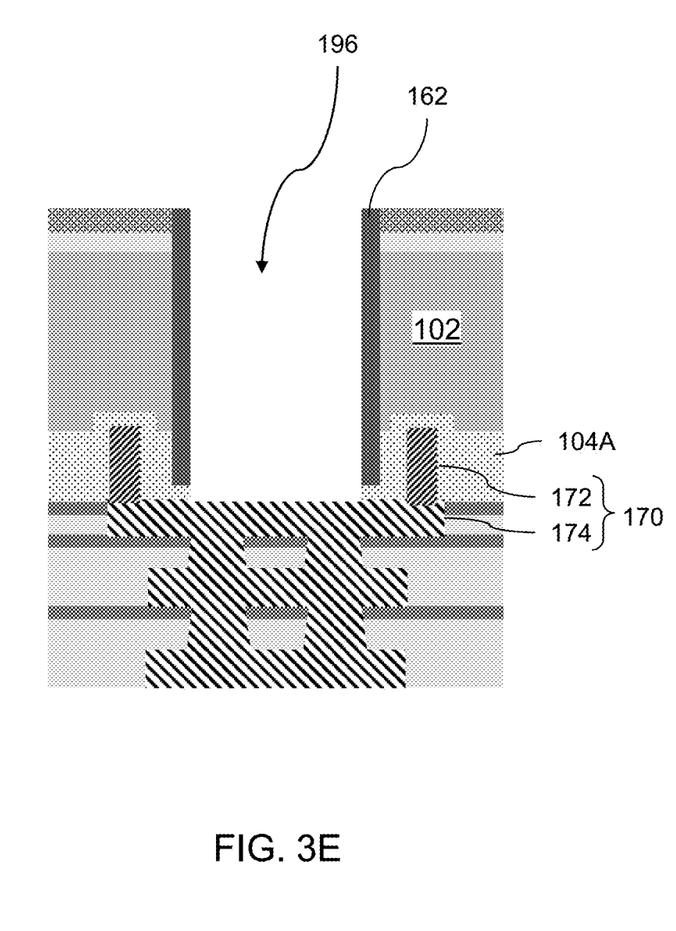

Referring to FIGS. 2 and 3E, in operation 25, a planarization process, such as chemical-mechanical planarization (CMP), may be performed to planarize the bonding layer 192 and remove barrier layer material disposed outside of the trench 196. An etch-back process may then be performed to remove a bottom portion of the barrier layer material 162M and the portion 104P of the substrate oxide layer 104A, to expose the barrier line 174 and form the diffusion barrier layer 162.

Figure 3F:
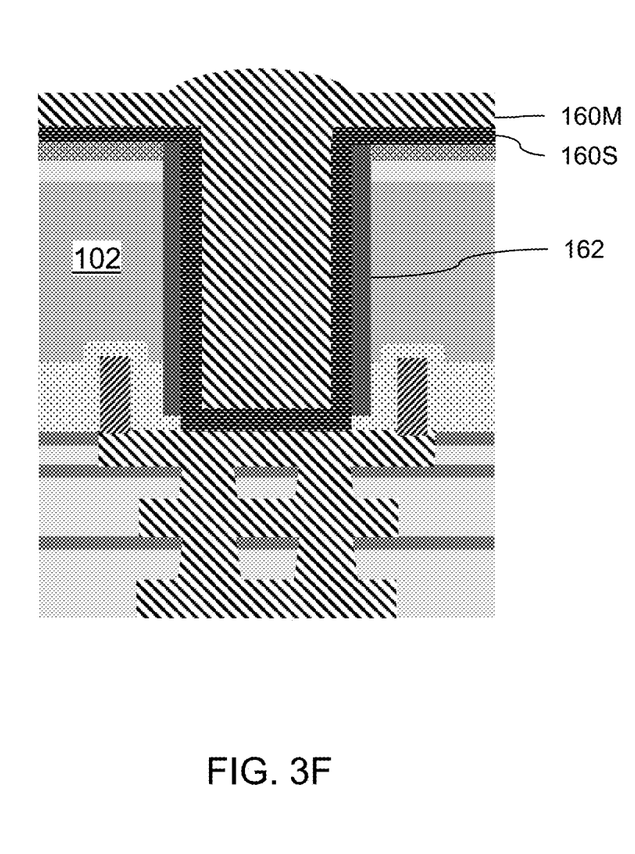

Referring to FIGS. 2 and 3F, in operation 26, a seed layer 160S may be deposited in the trench 196, and a TSV material layer 160M may be formed on the seed layer 160S. For example, the TSV material layer 160M may be grown on the seed layer 160S using an electrochemical plating process, or the like.

Figure 3G:
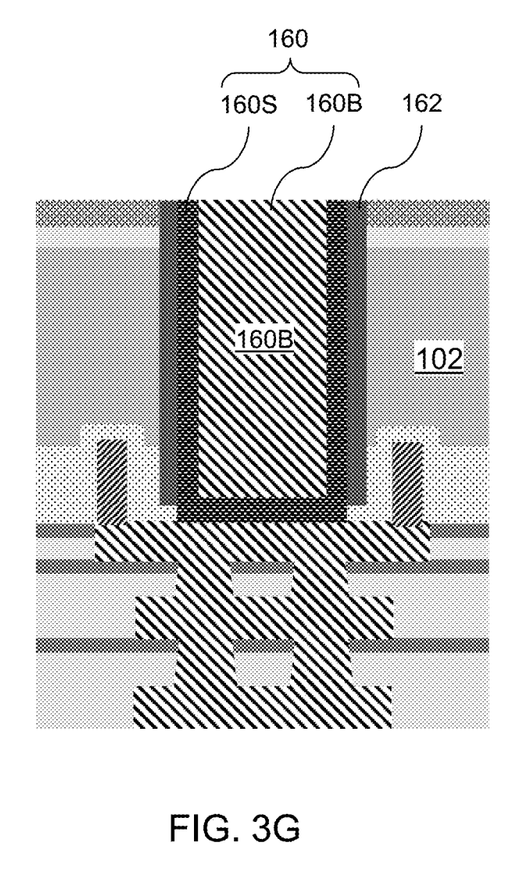

Referring to FIGS. 2 and 3G, in operation 27 a planarization process, such as CMP may be performed to remove portions of the seed layer 160S and the TSV material layer 160M disposed outside of the trench 196, and thereby planarize the back side of the semiconductor substrate 102 and form the body 160B and complete the TSV structure 160.

Figure 4:
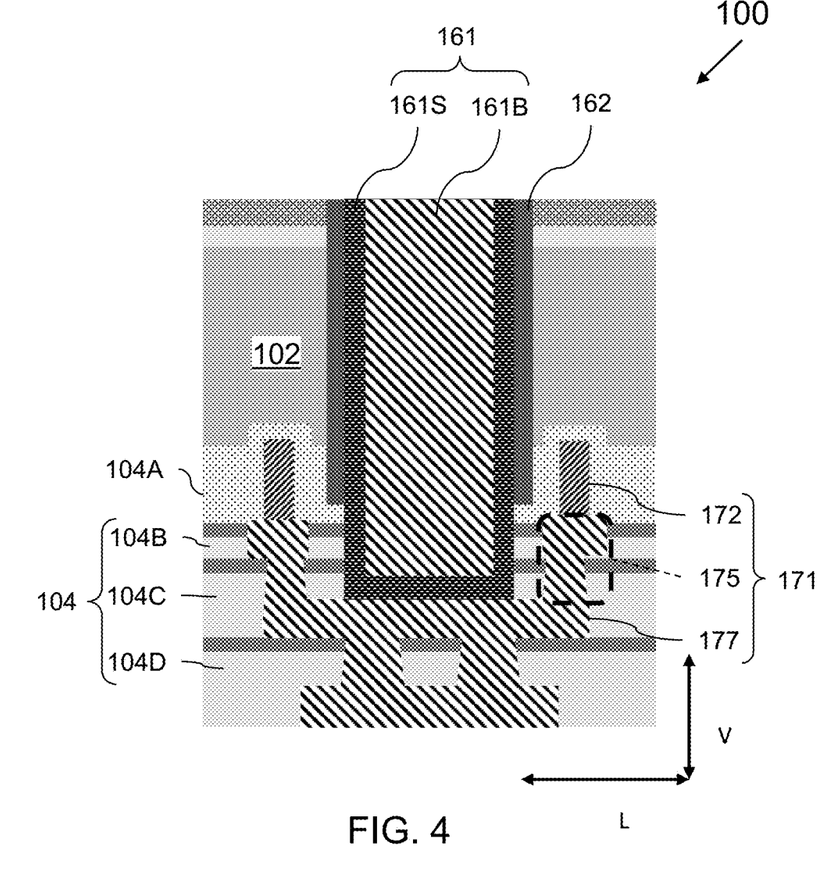
FIG. 4 is a vertical cross-sectional view of a modified version of a TSV structure and TSV barrier structure as shown in FIG. 3G, according to various embodiments of the present disclosure.

FIG. 4 is a vertical cross-sectional view of a modified version of a TSV structure 161 and TSV barrier structure 171 as shown in FIG. 3G, according to various embodiments of the present disclosure. Referring to FIG. 4, the TSV structure 161 and the TSV barrier structure 171 may be formed in a die 100, as shown in FIG. 1A. As such, a description of similar elements will not be repeated.

The TSV structure 161 may include a body 161B and a seed layer 161S from which the body 161B is grown, as described above with respect to the TSV structure 160. The seed layer 160S, 161S may be formed of an electrodeposition seed material, such as Ti, TiN, Cu, alloys thereof, or the like, and the body 160B, 161B may be formed of conductive materials such as Cu, Au, Ag, alloys thereof, or the like. The TSV structure 160, 161 may be disposed within a diffusion barrier layer 162 formed of a barrier material as described above, such as Ta, TaN, Ti, TiN, CoW, a combination thereof, or the like.

However, unlike the TSV structure 160 of FIG. 3G, the TSV structure 161 illustrated in FIG. 4 may extend into multiple layers of the dielectric structure 104. For example, the TSV structure 161 may extend through a first ILD layer 104B and into a second ILD layer 104C. However, in other embodiments, the TSV structure 161 may extend into additional ILD layers.

The TSV barrier structure 171 may include a first seal ring 172, a second seal ring 175, and a barrier line 177. The second seal ring 175 and barrier line 177 may include at least portions of metal features formed in the dielectric structure 104. For example, the second seal ring 175 may include at least portions of a metal line formed in a first ILD layer 104B and a via structure formed in a second ILD layer 104C. Accordingly, the second seal ring 175 and the barrier line 177 may be formed of conductive materials such as Cu, Ni, Au, Ag, Ti, W, Al, alloys thereof, or the like.

The barrier line 177 may include at least a portion of a metal line formed in the second ILD layer 104C. The barrier line 177 may directly contact the TSV structure 161. The second seal ring 175 may connect the barrier line 177 to the first seal ring 172, in a vertical direction V perpendicular to a plate of the semiconductor substrate 102. The first seal ring 172 and the second seal ring 175 may surround the TSV structure 160, 161 in a lateral direction L perpendicular to the vertical direction V.

Figure 5A:
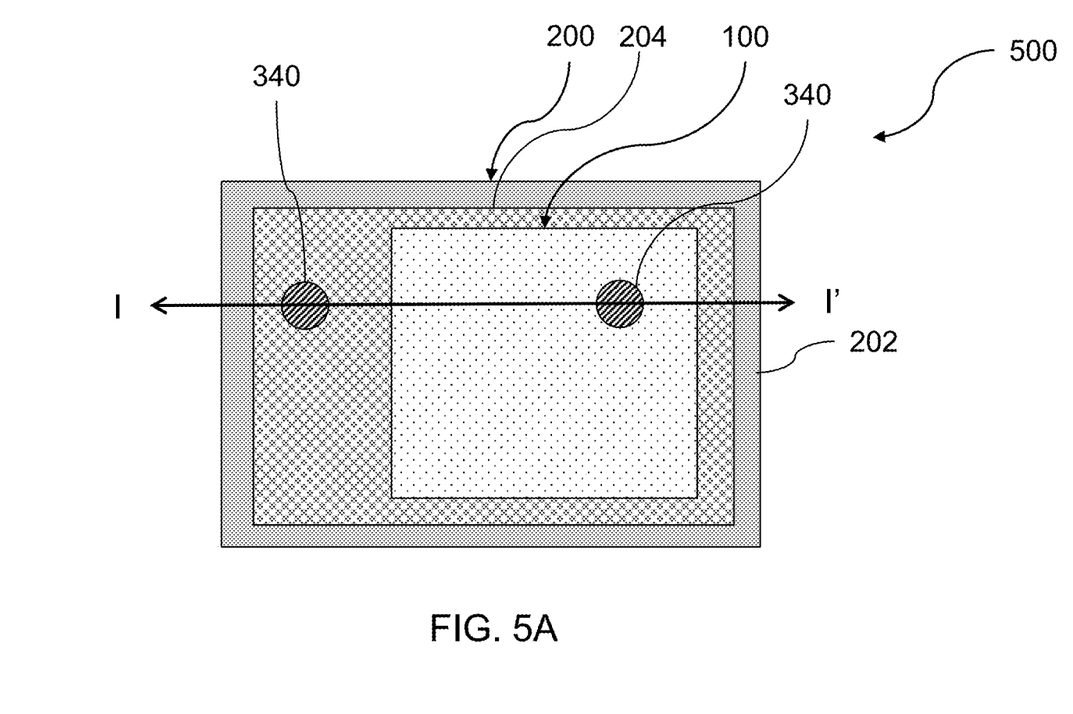
FIG. 5A is a simplified top view of a semiconductor package, according to various embodiments of the present disclosure.
Figure 5B:
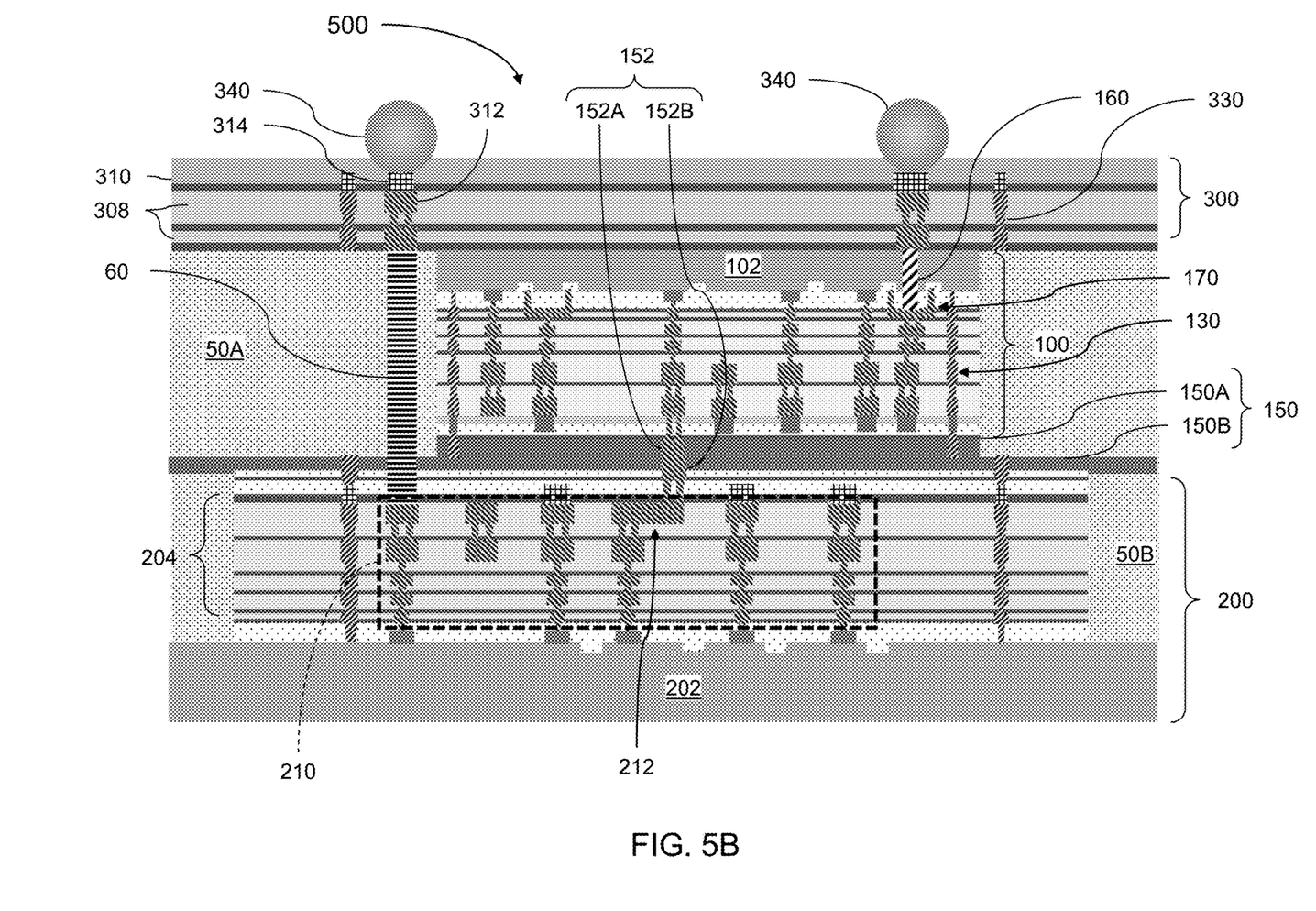
FIG. 5B is a vertical cross-sectional view taken along line I-I' of FIG. 5A.

FIG. 5A is a simplified top view of a semiconductor package 500, according to various embodiments of the present disclosure, and FIG. 5B is a vertical cross-sectional view taken along line I-I' of FIG. 5A. Referring to FIGS. 5A and 5B, the semiconductor package 500 may include a first die 100 disposed on a second die 200. The first die 100 may be similar to the die 100 shown in FIG. 1A. Accordingly, the features of the first die 100 will not be described again in detail.

The first die 100 may be bonded to the second die 200 by a bonding structure 150 including a first bonding layer 150A disposed on the first die 100 and a second bonding layer 150B disposed on the second die 200. A bonding pad structure 152, including a first bonding pad 152A disposed in the first bonding layer 150A and a second bonding pad 152B disposed in the second bonding layer 150B may electrically connect the first die 100 and the second die 200.

A first dielectric encapsulation (DE) layer 50A may surround the first die 100 and a second DE layer 50B may surround the second die 200. In various embodiments, the first DE layer 50A and the second DE layer 50B may include a molding compound. The molding compound may include a resin and a filler. In alternative embodiments, the first DE layer 50A and the second DE layer 50B may be formed of silicon oxide, silicon nitride, or a combination thereof. The first DE layer 50A and the second DE layer 50B may be formed by spin-coating, lamination, deposition, or the like.

A redistribution layer (RDL) structure 300 may be formed on the first die 100 and the first DE layer 50A. The RDL structure 300 may include one or more dielectric layers 308, metal features 312 disposed in the dielectric layers 308, a passivation layer 310 disposed on the dielectric layers 308, an RDL seal ring 330, and package bonding pads 314. In some embodiments, the package bonding pads 314 may be under bump metallization (UBM) pads for mounting conductive connectors, such as metal pillars, .mu.-bumps or the like. The package bonding pads 314 may include a metal or a metal alloy. The package bonding pads 314 may include aluminum, copper, nickel, an alloy thereof, or the like, for example. Other suitable pad materials may be within the contemplated scope of disclosure.

Upper surfaces of the package bonding pads 314 may be exposed through the passivation layer 310. In some embodiments, the passivation layer 310 includes silicon oxide, silicon nitride, benzocyclobutene (BCB) polymer, polyimide (PI), polybenzoxazole (PBO), a combination thereof, or the like. Other suitable passivation layer materials may be within the contemplated scope of disclosure. The RDL seal ring 330 may include materials and structures similar to that of the die seal ring 130.

The RDL structure 300 may be configured to connect the semiconductor package 500 to external components via electrical contacts 340, such as solder balls or the like, electrically connected to the package bonding pads 314. In particular, the semiconductor package 500 may include a through-dielectric via (TDV) structure 60 that extends through the first DE layer 50A and electrically connects the second die 200 to the RDL structure 300. The first die 100 may be electrically connected to the RDL structure 300 by the TSV structure 160.

In some embodiments, the TDV structure 60 may include an electrically conductive material, such as Cu, Ti, Ni, Au, Ag, Al, combinations thereof, or the like. In some embodiments, a diffusion barrier layer (not shown) may be disposed around the TDV structure 60, to prevent metal diffusion into the first DE layer 50A. The diffusion barrier layer may include Ta, TaN, Ti, TiN, CoW, or a combination thereof. Other suitable barrier layer materials may be within the contemplated scope of disclosure.

The second die 200 may include a semiconductor substrate 202, ILD layers 204, and an interconnect structure 210 including metal features 212. The interconnect structure 210 may be electrically connected to the TDV structure 60 and the bonding pad structure 152.

Various embodiments of the present disclosure provide a die 100 that may include: a semiconductor substrate 102 having a front side 102F and an opposing back side 102B; a dielectric structure 104 that may include a substrate oxide layer 104A disposed on the front side 102F of the semiconductor substrate 202 and interlayer dielectric (ILD) layers 104B-104F disposed on the substrate oxide layer 104A; an interconnect structure 110 disposed in the dielectric structure 104; a through-silicon via (TSV) structure 160 extending in a vertical direction from the back side 102B of the semiconductor substrate 102 through the front side 102F of the semiconductor substrate 102, such that a first end 160E1 of the TSV structure 160 is disposed in the dielectric structure 104; and a TSV barrier structure 170 that may include: a barrier line 174 that contacts the first end E1 of the TSV structure 160; and a first seal ring 172 disposed in the substrate oxide layer 104A and that that surrounds the TSV structure 160 in a lateral direction perpendicular to the vertical direction.

In one embodiment, the first seal ring 172 directly contacts the barrier line 174 and extends toward the semiconductor substrate 102 in the vertical direction. In one embodiment, the barrier line 174 may be disposed on the substrate oxide layer 104A and in one of the ILD layers 104. In one embodiment, the barrier line 174 covers the first seal ring 172 and the TSV structure 160, 161 in the vertical direction. In one embodiment, the die may further include a die seal ring 130 disposed in the dielectric structure 104 and that surrounds the TSV barrier structure 170 and the interconnect structure 110, wherein the barrier line 174 electrically connects the TSV structure 160, 161 to the interconnect structure 110. In one embodiment, the barrier line 174 may include copper; and the first seal ring 172 may include tungsten. In one embodiment, a minimum distance between the first seal ring 172 and the TSV structure 160, 161 may be the same in any lateral direction perpendicular to the vertical direction, such that the first seal ring 172 may have an equipotential structure with respect to the TSV structure 160, 161. In one embodiment, the die may further include a diffusion barrier layer 162 disposed between the TSV structure 160, 161 and the semiconductor substrate 102, the diffusion barrier 162 configured to reduce metal diffusion from the TSV structure 160, 161. In one embodiment, the diffusion barrier layer 162 may extend into the dielectric structure 104, such that the diffusion barrier layer 162 may be disposed between the first seal ring 172 and the TSV structure 160, 161. In one embodiment, the die may include a second seal ring 175 that surrounds the TSV structure 160, 161 in the lateral direction and that extends through at least one of the ILD layers 104B-104F, from the barrier line 174 to the first seal ring 172. In one embodiment, the first seal ring 172 may include tungsten; and the second seal ring 175, barrier line 174, and the TSV structure 160, 161 may include copper. In one embodiment, the second seal ring 175 may extend through at least two of the ILD layers 104B-104F. In one embodiment, the die may also include a diffusion barrier layer 162 disposed between the TSV structure 160, 161 and the semiconductor substrate 102 and configured to reduce metal diffusion from the TSV structure 160, 161.

Various embodiments of the present disclosure provide a semiconductor package that may include a first die 100 and a second die 200 bonded to the first die 100. The first die 100 may include: a semiconductor substrate 102 having a front side 102F and an opposing back side 102B; a dielectric structure 104 that may include a substrate oxide layer 104A disposed on the front side of the semiconductor substrate and interlayer dielectric (ILD) layers 104B-104F disposed on the substrate oxide layer 104A; an interconnect structure 110 disposed in the dielectric structure 104; a through-silicon via (TSV) structure 160 extending in a vertical direction from the back side 102B of the semiconductor substrate 102 through the front side 102F of the semiconductor substrate 102, such that a first end 160E1 of the TSV structure 160 is disposed in the dielectric structure 104; and a TSV barrier structure 170 that may include: a barrier line 174 that contacts the first end 160E1 of the TSV structure 160; and a first seal ring 172 disposed in the substrate oxide layer 104A and that surrounds the TSV structure 160 in a lateral direction perpendicular to the vertical direction. The second die 200 may include a semiconductor substrate 202 and an interconnect structure 210 that is electrically connected to the interconnect structure 110 of the first die 100.

In one embodiment, the semiconductor package may also include a diffusion barrier layer 162 disposed between the TSV structure 160, 161 and the semiconductor substrate 102, the diffusion barrier layer 162 configured to reduce metal diffusion from the TSV structure 160, 161, wherein the first seal ring 172 directly contacts the barrier line 174 and extends toward the semiconductor substrate 102 in the vertical direction. In one embodiment, the TSV barrier structure 170 may include a second seal ring 175 that surrounds the TSV structure 160, 161 in the lateral direction and that extends through at least one ILD layer 104B-104F of the dielectric structure 104, from the barrier line 174 to the first seal ring 172.

Various embodiments of the present disclosure provide a method of forming a through-silicon via (TSV) structure, that may include the operations of: bonding a die 100 to a carrier wafer 350, the die 100 may include a semiconductor substrate, a dielectric structure 104 disposed on a front side 102F of the semiconductor substrate 102 and bonded to the carrier wafer 350, and a TSV barrier structure 170 disposed in the dielectric structure 104; etching a back side 102B of the semiconductor substrate 102 to form a trench 196 that is disposed over the TSV barrier structure 170; forming a diffusion barrier layer 162 on sidewalls of the trench 196; forming a seed layer 160S on the diffusion barrier layer 162, a barrier line 174 exposed at a bottom of the trench 196, and the back side 102B of the semiconductor substrate 102; forming a TSV material layer 160M on the seed layer 160S; and planarizing the back side 102B of the semiconductor substrate 102 to form the TSV structure 160.

In one embodiment, the method of forming the TSV structure 160, 161 wherein the forming a diffusion barrier layer may include the operations of: depositing a diffusion barrier material 162 layer in the trench 196 and on the back side of the semiconductor substrate 102B; planarizing the semiconductor substrate 102 to remove the diffusion barrier 162 material from the back side 102B of the semiconductor substrate 102; and performing an etch-back process to remove the diffusion barrier 162 material from the bottom of the trench 196 to complete the barrier layer 162 and expose the barrier line 174. In one embodiment, the trench 196 may be disposed inside of a first seal ring structure 172 of the TSV barrier structure 170; and the first seal ring 172 structure may be disposed in a substrate oxide layer 104A of the dielectric structure 104. In one embodiment, the forming of a TSV material layer 160M comprises using an electrochemical plating process.

The various embodiment structures and methods disclosed herein provide for a back side through substrate via (BTSV) that is designed with a guard ring structure to avoid the moisture and contaminants that may arise during the manufacturing process of other devices and circuitry. The embodiment BTSV with a FEOL/MEOL/BEOL guard ring is designed to avoid low yield or reliability of device and circuitry caused by moisture and contamination in the BTSV process. (FEOL/MEOL/BEOL guard ring can be used alone or in combination with other structures). The function of the FEOL+MEOL guard ring is to prevent or slow down the intrusion of moisture and contaminants into the FEOL+MEOL. The material may include a metal (Ex: W, metal gate) and a non-metal (EX: SiO2, USG, SiN, etc.)

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a through-silicon via (TSV) structure, comprising:
    forming a die comprising a semiconductor substrate, a substrate oxide layer disposed on a front side of the semiconductor substrate, a barrier line disposed on the substrate oxide layer, dielectric layers disposed on the substrate oxide layer and the barrier line, and a first seal ring that extends in a vertical direction from the barrier line into the substrate oxide layer;
    etching a back side of the semiconductor substrate to form a trench that extends through the semiconductor substrate and inside of the first seal ring;
    forming a diffusion barrier layer on sidewalls of the trench, such a portion of the substrate oxide layer is disposed between the diffusion barrier layer and the first seal ring in a lateral direction perpendicular to the vertical direction;
    forming a seed layer on the diffusion barrier layer, a portion of the barrier line exposed at a bottom of the trench, and the back side of the semiconductor substrate;
    forming a TSV material layer on the seed layer; and
    performing a planarization process to remove the TSV material layer from the back side of the semiconductor substrate and form the TSV structure.

2. The method of claim 1, wherein the forming of the diffusion barrier layer comprises:
    depositing a diffusion barrier layer material in the trench and on the back side of the semiconductor substrate;
    planarizing the semiconductor substrate to remove the diffusion barrier layer material from the back side of the semiconductor substrate; and
    performing an etch-back process to remove the diffusion barrier material from the bottom of the trench to complete the barrier layer and expose the barrier line.

3. The method of claim 2, wherein:
    the trench is disposed inside of the first seal ring; and
    the first seal ring is disposed in the substrate oxide layer.

4. The method of claim 2, wherein the die comprises:
    a second seal ring that extends from the first seal ring to the barrier line;
    wherein the first seal ring, the second seal ring, and the barrier line surround an end of the TSV structure.

5. The method of claim 2, wherein the forming of the TSV material layer on the seed layer comprises using an electrochemical plating process.

6. The method of claim 1, further comprising, prior to forming the trench:
    depositing a protection layer on the back side of the semiconductor substrate;
    depositing a bonding layer on the protection layer; and
    forming a patterned photoresist layer on the bonding layer.

7. The method of claim 6, wherein the forming of the trench comprises etching the bonding layer, the protection layer, and the semiconductor layer, using the patterned photoresist layer as a mask.

8. The method of claim 6, wherein:
    the diffusion barrier layer comprises tantalum (Ta), tantalum nitride (TaN), titanium (Ti), titanium nitride (TiN), cobalt-tungsten (CoW), or a combination thereof;
    the TSV structure comprises copper (Cu), a copper alloy, aluminum (Al), an aluminum alloy, silver (Ag), or a combination thereof; and
    the seed layer comprises titanium (Ti), titanium nitride (TiN), copper (Cu), a copper alloy, or a combination thereof.

9. The method of claim 1, wherein the barrier line is part of an interconnect structure disposed in the dielectric layers and electrically connected to semiconductor devices of the semiconductor substrate.

10. A method of forming a through-silicon via (TSV) structure in a die, the method comprising:
- forming a protective layer and a bonding layer on a back side of a semiconductor substrate of the die, the die comprising a substrate oxide layer disposed on a front side of the semiconductor substrate, a barrier line disposed on the substrate oxide layer, and a first seal ring that extends in a vertical direction from the barrier line into the substrate oxide layer;
- forming a trench that extends through the semiconductor substrate and is laterally surrounded by the first seal ring;
- forming a diffusion barrier layer on sidewalls of the trench, such that a portion of the substrate oxide layer is disposed between the diffusion barrier layer and the first seal ring in a lateral direction perpendicular to the vertical direction;
- forming a seed layer in the trench; and
- forming a TSV structure in the trench and on the seed layer.

11. The method of claim 10, wherein the forming of the trench comprises:
- forming a patterned photoresist layer on the bonding layer;
- etching the bonding layer, the protection layer, the semiconductor substrate, and a portion of the dielectric structure, using the patterned photoresist layer as a mask.

12. The method of claim 10, wherein the forming of the diffusion barrier layer comprises:
- depositing a barrier layer material on the bonding layer and in the trench;
- performing a planarization process to remove the barrier layer material from a top surface of the bonding layer; and
- performing an etch-back process to remove the barrier layer material from a portion of the barrier line and form the barrier layer.

13. The method of claim 12, wherein the performing of the etch-back process comprises removing the barrier layer material from a barrier line of the TSV barrier structure.

14. The method of claim 13, wherein the forming of the seed layer comprises depositing the seed layer on the bonding layer, the barrier layer, and the barrier line.

15. The method of claim 14, wherein the wherein the forming of the TSV structure comprises:
- growing a TSV material layer on the seed layer; and
- performing a planarization process to remove TSV material layer and the seed layer from the top surface of the bonding layer.

16. The method of claim 15, wherein the first seal ring and the barrier line surround an end of the TSV structure.

17. The method of claim 15, wherein the TSV barrier structure comprises:
- a second seal ring that extends from the first seal ring to the barrier line;
- wherein the first seal ring, the second seal ring, and the barrier line surround an end of the TSV structure.

18. A method of forming a through-silicon via (TSV) structure in a die comprising a semiconductor substrate, a substrate oxide layer disposed on a front side of the semiconductor substrate, a barrier line disposed on the substrate oxide layer, and a seal ring that extends in a vertical direction from the barrier line into the substrate oxide layer, the method comprising:
- forming a trench that extends through the semiconductor substrate, and inside of the seal ring, such that a portion of the substrate oxide layer is disposed on the barrier line and forms a bottom of the trench;
- forming a barrier layer that covers sidewalls of the trench, such that a portion of the substrate oxide layer is disposed between the barrier layer and the seal ring in a horizontal direction perpendicular to the vertical direction;
- forming a seed layer that covers the barrier layer and the exposed portion of barrier line; and
- forming a TSV structure on the seed layer and inside of the trench.

19. The method of claim 18, wherein the first seal ring and the barrier line surround an end of the TSV structure.

20. The method of claim 18, wherein the barrier line comprises part of an interconnect structure disposed in the dielectric structure and electrically connected to the semiconductor substrate.

* * * * *